United States Patent

Tulp et al.

[15] 3,678,347

[45] July 18, 1972

[54] DEEP DEPLETION SEMICONDUCTOR DEVICE WITH SURFACE INVERSION PREVENTING MEANS

[72] Inventors: Theodorus Joannes Tulp; Johannes Arnoldus Appels; Else Kooi, all of Emmasingel, Eindhoven, Netherlands

[73] Assignee: U.S. Philips Corporation, New York, N.Y.

[22] Filed: June 24, 1970

[21] Appl. No.: 49,403

[30] Foreign Application Priority Data

July 1, 1969 Netherlands..........................6910027

[52] U.S. Cl.......................317/235 R, 317/235 B, 317/235 D

[51] Int. Cl.........................................................H01l 11/14

[58] Field of Search..................................................317/235

[56] References Cited

UNITED STATES PATENTS

| | | | |
|---|---|---|---|
| 3,385,731 | 5/1968 | Weimer | 317/235 |
| 3,535,600 | 10/1970 | Engeler | 317/235 |
| 3,560,815 | 2/1971 | Sigsbee | 317/235 |
| 3,566,219 | 2/1971 | Nelson et al. | 317/235 |
| 3,576,392 | 4/1971 | Hotstein | 317/235 |

OTHER PUBLICATIONS

IBM Tech. Disel Bul, " MESFET with Threshold Source–Drain Voltage" , by Jutzi, Vol. 11, No. 9, Feb. 1969 page 1184

*Primary Examiner*—Jerry D. Craig
*Attorney*—Frank R. Trifari

[57] ABSTRACT

A semiconductor device, for example, a deep-depletion field effection traNsistor, in which the formation of an inversion layer below an electrode provided on an insulating layer is counteracted by a rectifying contact preferably connected to said electrode, as a result of which minority charge carriers below the electrode layer are removed. As a result of this a depletion zone formed by the electrode potential in a semiconductor layer situated below the electrode can expand without hindrance to influence a current path in the semiconductor layer.

11 Claims, 11 Drawing Figures

Figure 1:
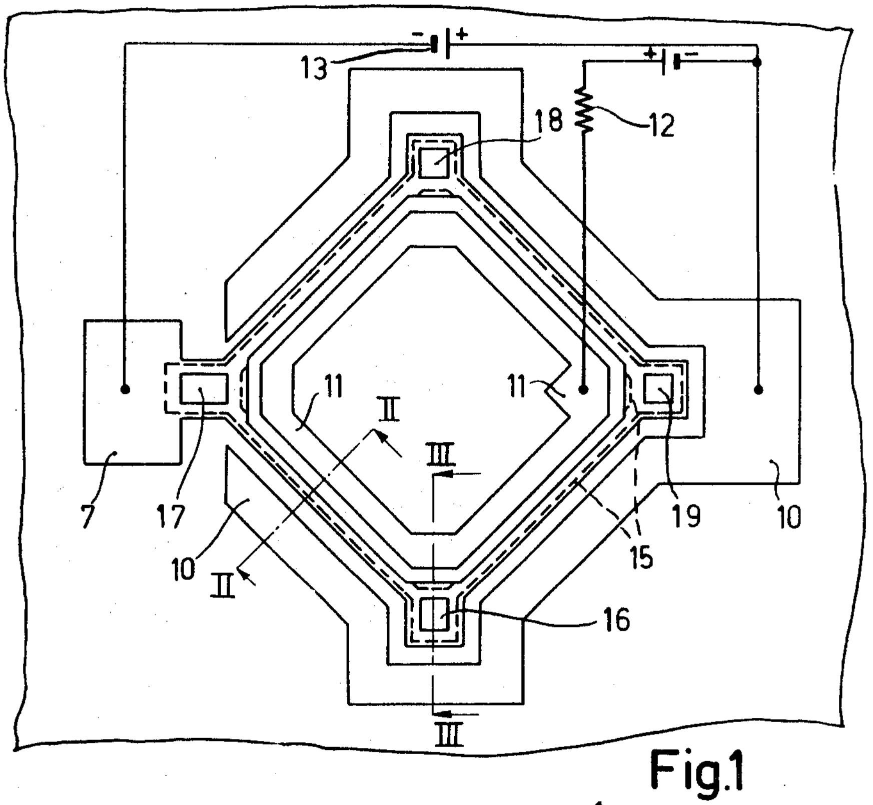

INVENTORS
THEODORUS J. TULP
JOHANNES A. APPELS
ELSE KOOI
BY
Frank R. Trifari
AGENT INVENTORS
THEODORUS J. TULP
JOHANNES A. APPELS
ELSE KOOI
BY
Frank R. Trifari
AGENT INVENTORS
THEODORUS J. TULP
JOHANNES A. APPELS
ELSE KOOI
BY
Frank R. Trifari
AGENT INVENTORS
THEODORUS J. TULP
JOHANNES A. APPELS
ELSE KOOI
BY
Frank R. Trifari
AGENTS

DEEP DEPLETION SEMICONDUCTOR DEVICE WITH SURFACE INVERSION PREVENTING MEANS

The invention relates to a semiconductor device having a semiconductor body comprising a region of a first conductivity type in the form of a layer adjoining a surface of the body, said region being covered at said surface at least partly by an electrically insulating layer, on which insulating layer an electrode layer is provided for forming a depletion zone in the said layer-shaped region to influence the electric resistance of said region in a direction parallel to the surface. Devices of the type described are known and are used inter alia for controlling or amplifying electric signals. A known embodiment of such a device is an insulated-gate field effect transistor, in particular the so-called "deep-depletion" field effect transistor, as described in "IEEE Transactions on Electron devices", ED 13, nr. 12, Dec., 1966, pp. 846 – 855 and pp. 855 – 862. Such a field effect transistor generally consists of a thin semiconductor layer which is provided on an electrically insulating substrate and comprises a source and drain electrode. The gate electrode is provided between the source and drain electrodes on an insulating layer situated on the semiconductor layer. By setting up a voltage difference between the gate electrode and the semiconductor layer such that majority charge carriers are forced out of the semiconductor layer, a depletion zone is formed in said layer which zone can extend, if desirable, throughout the thickness of the layer and can considerably influence the resistance of the current path between the source and drain electrodes.

If such a depletion zone extends throughout the thickness of the semiconductor layer in the form of a ring, it could also be used, for example, to electrically isolate the part of the semiconductor layer situated within the angular depletion zone from the remaining part of the layer.

In all these cases it is desirable that the depletion zone, starting from the surface, can extend over at least a considerable part of the thickness of the semiconductor layer.

However, the phenomenon often occurs that minority charge carriers which are formed in the depletion zone by generation accumulate as a result of the potential of the said electrode layer in a surface zone below the insulating layer and give rise there to the formation of a so-called inversion layer of a conductivity type opposite to that of the semiconductor layer. Such an inversion layer prevents the further expansion of the depletion layer in the semiconductor layer and thus adversely and often inadmissibly influences the functioning of the semiconductor device.

One of the objects of the invention is to provide a device in which the above-mentioned difficulties occurring in semiconductor devices of the type in question are avoided or at least reduced considerably.

The invention is based inter alia on the recognition of the fact that the formation of an inversion layer can be avoided or at least considerably hampered by efficaciously providing a rectifying contact on or in the layer-shaped region of the first conductivity type, so that the electric properties of the device are considerably improved.

A semiconductor device of the type mentioned in the preamble is therefore characterized according to the invention in that, in order to counteract the formation of an inversion layer below the electrode layer, at least one rectifying contact which comprises a connection conductor is provided on the layer-shaped region. By polarizing the rectifying contact according to the invention in the reverse direction, minority charge carriers are drained from the said surface zone so that said minority charge carriers can no longer give rise to the formation of an inversion layer.

The invention is of particular importance for those devices in which the depletion zone is to extend comparatively deep in a layer-shaped region since in particular in those cases the presence of an inversion layer is very harmful. In connection herewith, a preferred embodiment of the device according to the invention is characterized in that the layer-shaped region has such a thickness and doping concentration that the depletion zone can extend throughout the thickness of the layer-shaped region.

The rectifying contact can be polarized in various manners in the reverse direction via the connection conductor. This can be effected particularly simply by directly d.c. connecting the rectifying contact to the electrode layer. Actually, in order to form the depletion zone, said electrode layer should be applied to such a potential relative to the layer-shaped region that the rectifying contact is polarized in the reverse direction when the said connection conductor is connected to said potential.

A direct d.c. connection is to be understood to mean herein conventionally a connection via an electric conductor, for example, a metal wire, a metal track, or a readily conducting semiconductor region, for example, a highly-doped zone.

According to a further preferred embodiment the rectifying contact is formed by a metal layer provided on the layer-shaped region of the first conductivity type, said layer forming a rectifying metal-semiconductor contact with said region. Said rectifying metal-semiconductor contact can be effected particularly simply by using for said purpose a part of the said electrode layer. An important preferred embodiment of the device according to the invention is therefore characterized in that the electrode layer consists of a metal which can form a rectifying contact with the layer-shaped region of the first conductivity type and that the electrode layer adjoins the said layer-shaped region via an aperture in the insulating layer.

Advantageously, the rectifying contact may also comprise a p-n junction. According to a further preferred embodiment the rectifying contact is therefore formed by a zone of the second conductivity type provided on or in said layer-shaped region of the first conductivity type. The electrode layer itself can advantageously be used as a connection conductor for the rectifying contact, said layer in this case adjoining the said zone of the second conductivity type via an aperture in the insulating layer.

According to an important preferred embodiment the layer-shaped region of the first conductivity type, preferably in the form of an epitaxially grown monocrystalline semiconductor layer, is provided on an electrically insulating substrate. So in this case the layer-shaped region is bounded by the substrate on the side remote from the surface. According to another important preferred embodiment the layer-shaped region on said side does not adjoin an insulating substrate but adjoins a region of the second conductivity type which forms a p-n junction with the layer-shaped region.

As already noted above, the invention is of particular interest in the case in which the device is a field-effect transistor the source and drain electrodes of which are provided on or in the layer-shaped region of the first conductivity type and in which the gate electrode of the field effect transistor is formed by the said electrode layer. The source and drain electrodes are preferably formed by zones of the first conductivity type adjoining the surface, said zones extending throughout the thickness of the layer-shaped region and having a higher doping than said region, so that a "deep-depletion" field effect transistor is obtained. In these transistors it is very desirable that the depletion zone formed by the gate electrode can penetrate through the layer-shaped regions throughout its thickness so that the invention is of great importance in this case.

For the same reason, the invention is also of particular advantage in a device in which the layer-shaped region is formed by a semiconductor layer of the first conductivity type which is provided on and is electrically insulated from a substrate, the electrode layer being constructed in the form of a conductor which substantially entirely surrounds one or more semiconductor circuit elements provided in the said semiconductor layer, the semiconductor layer having a thickness and doping concentration such that the depletion zone can extend throughout the thickness of the semiconductor layer. The part of the semiconductor layer which is situated within the said conductor can be electrically insulated, with the circuit elements present therein, from the remaining parts of the semiconductor layer when the depletion zone extends throughout the thickness of the layer, which is considerably facilitated by using the invention as already described above.

It is to be noted that it is known to electrically insulate parts of the semiconductor layer by annular surface layers of a conductivity type opposite to that of the semiconductor layer, which zones can form a p-n junction with the layer. The desirable insulation is obtained by setting up such a high reverse voltage across said p-n junction that the depletion zone extends throughout the layer thickness (see IEEE Internation Solid State Circuits Conference, Digest of Technical Papers, Feb., 1969, pp 150 – 151). A drawback of this known structure is that the said p-n junction occupies comparatively much space by lateral diffusion and shows a fair chance of defects owing to its comparatively large circumference and area. In the above-described insulation methods according to the invention, only a very narrow strip-shaped conductor need be provided on the insulating layer, which conductor has a width which is so small that it can practically not be realized in the annular diffused zone according to the described known construction. According to the invention the said conductor need be provided only with one or a few small rectifying contacts. If these are constructed in the form of diffused zones of a conductivity type opposite to that of the semiconductor layer, said zones can also be used for effecting cross-overs in that a metal strip present on the insulating layer adjoins one of the said diffused zones on either side of the said conductor via contact apertures in the insulating layer. The number of and the mutual distance between the rectifying contacts associated with an electrode layer depends inter alia on the distance which minority charge carriers can cover in the layer-shaped region before recombination. The distance between two adjacent rectifying contacts associated with the same electrode layer is advantageously chosen to be at most equal to two diffusion lengths of the said minority charge carriers in the layer-shaped region of the first conductivity type.

Figure 2:
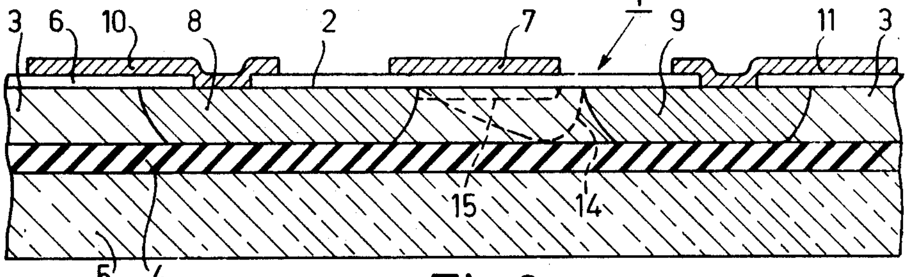
Figure 3:
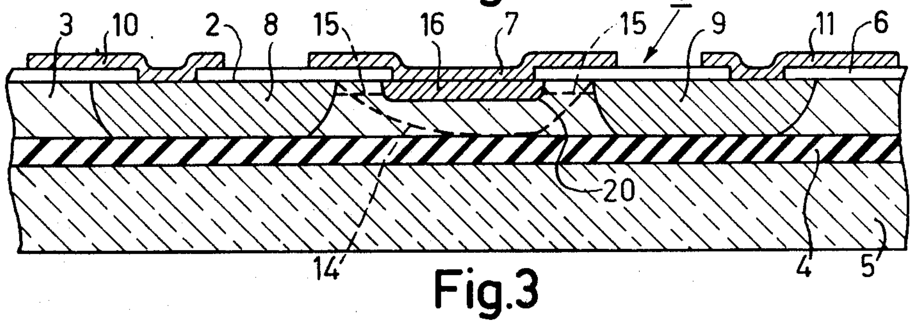
Figure 4:
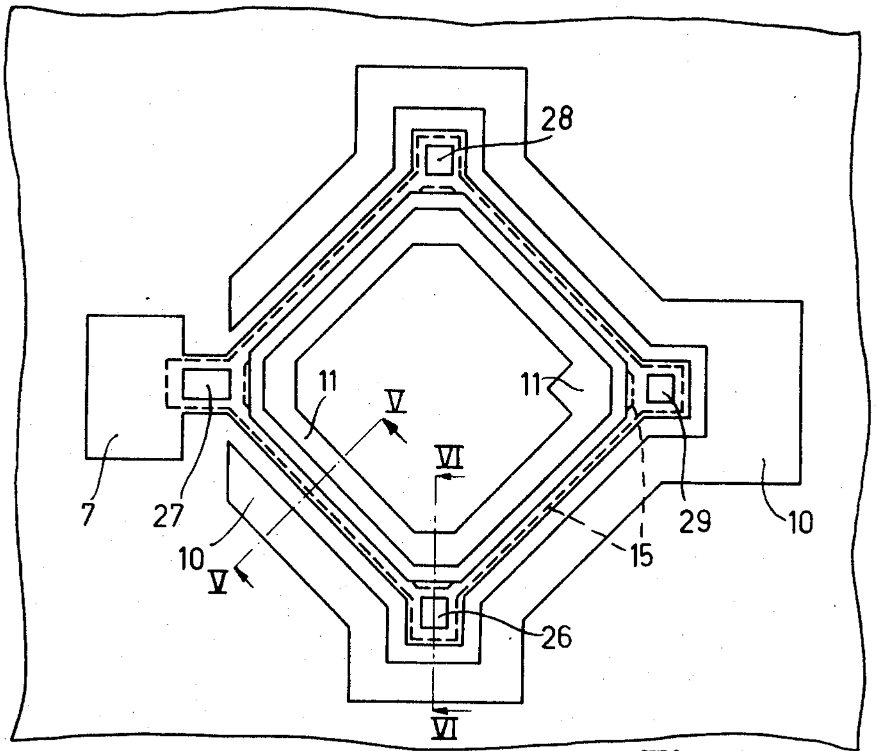
Figure 5:
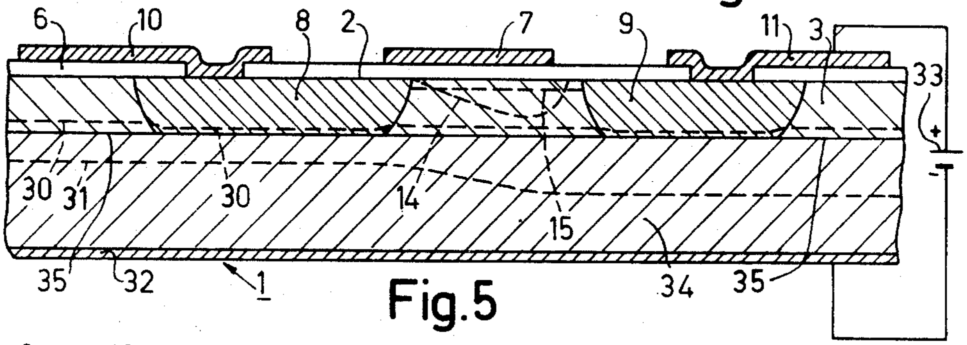
Figure 6:
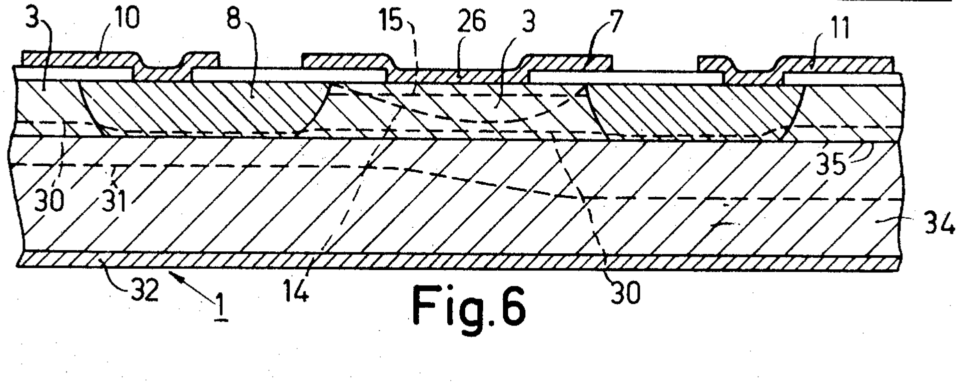
Figure 7:
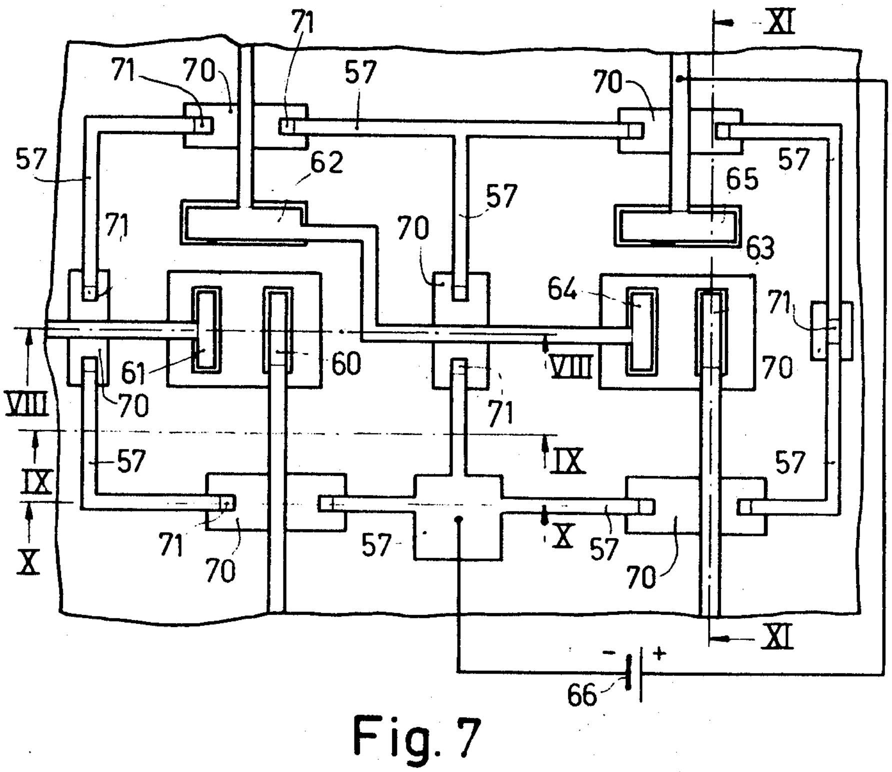
Figure 8:
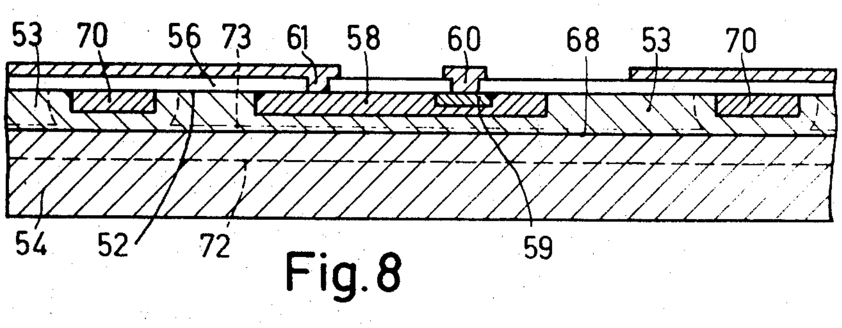
Figure 9:
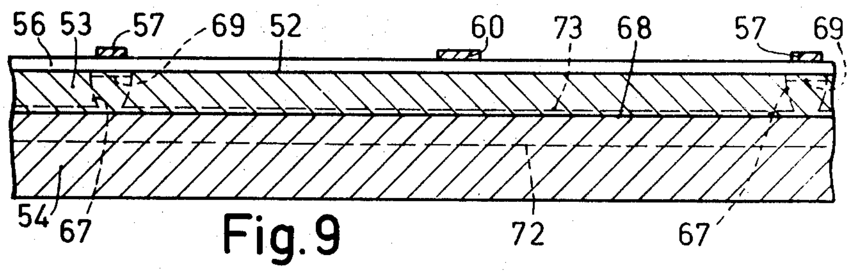
Figure 10:
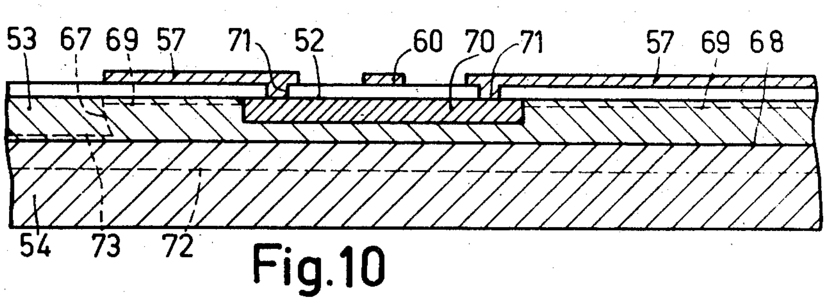
Figure 11:
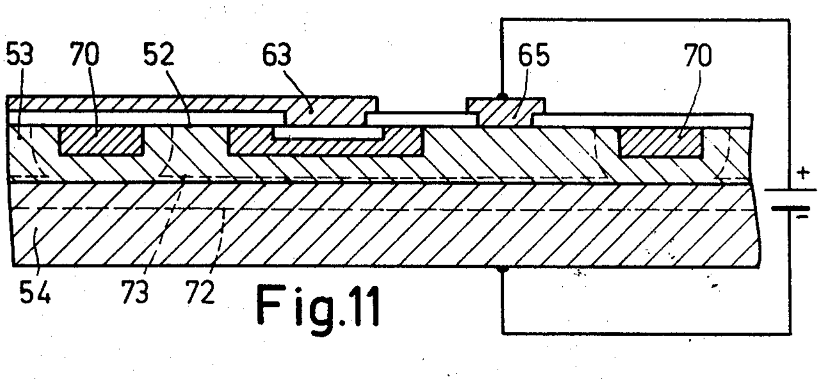

In order that the invention may be readily carried into effect, a few examples thereof will now be described in greater detail with reference to the accompanying drawings, in which:

FIG. 1 is a plan view of a semiconductor device according to the invention,

FIGS. 2 and 3 are diagrammatic cross-sectional views of the device taken on the lines II — II and III — III of FIG. 1, FIG. 4 is a plan view of another device according to the invention, FIGS. 5 and 6 are diagrammatic cross-sectional views of said device taken on the lines V — V and VI — VI of FIG. 4, FIG. 7 is a plan view of a third device according to the invention, and FIGS. 8 – 11 are diagrammatic cross-sectional views of said device taken on the lines VIII — VIII, IX — IX, X — X and XI — XI of FIG. 7.

The Figures are diagrammatic and not drawn to scale, particularly the dimensions in the direction of the thickness being comparatively strongly exaggerated for clarity. Corresponding components are generally referred to by the same reference numerals in the Figures.

FIG. 1 is a plan view and FIGS. 2 and 3 are diagrammatic cross-sectional views taken on the lines II — II and III — III of FIG. 1 of a semiconductor device according to the invention in the form of an insulated-gate field effect transistor. The device comprises a silicon semiconductor body 1 comprising a layer-shaped region 3 adjoining a substantially plane surface 2 of the body. The layer-shaped region 3 consists of a monocrystalline *n*-type silicon layer having a resistivity of approximately 10 Ω cm and a thickness of 2 μm which is provided on an electrically insulating substrate 4 which in this example consists of a polymer, for example, an epoxy resin, which itself is provided on a glass support 5.

The layer-shaped region 3 is covered at the surface 2 by an electrically insulating layer 6 of silicon oxide, 0.2 μm thick. An electrode layer 7 in the form of an aluminum layer, approximately 0.5 μm thick, is provided on said layer 6. Said electrode layer 7 constitutes the gate electrode of the field effect transistor.

Source and drain electrodes in the form of diffused *n*-type zones 8 and 9 extending throughout the thickness of the layer 3 are furthermore provided in the layer-shaped region 3, which electrodes are connected to aluminum connection contacts 10 and 11 through windows in the oxide layer 6. The source and drain zones 8 and 9 have a surface concentration of approximately $10^{20}$ donor atoms per ccm.

In the operating condition a voltage difference is applied, for example, via a load resistor 12 (see FIG. 1), between the connection contacts 10 and 11 so that majority charge carriers (in this example electrons) flow via the layer 3 from the source contact 10 to the drain contact 11.

The gate electrode 7 is set up at a potential which is negative relative to the part of the silicon layer 3, see FIG. 1, situated underneath the gate electrode 7, by means of a voltage source 13. As a result of this the electrons in the part of the layer 3 situated below the electrode layer 7 are substantially forced away out of a depletion zone 14 the boundary of which is shown in broken lines in FIG. 2. The depth over which the zone 14 extends in the layer 3 depends upon the potential difference between the gate electrode and the underlying region 3. In FIGS. 2 and 3 the zone 14 extends throughout the thickness of the layer 3. The depletion zone 14 influences the resistance of the layer-shaped region 3 in a direction parallel to the surface 2, so that the current between the source and drain contacts 10 and 11 can be controlled by means of a control voltage on the gate layer 7.

In the above-described field effect transistor, electron-hole pairs will be formed in the depletion zone 14 by generation. As a result of the negative potential of the gate electrode 7, the holes below said electrode 7 will be retained at the surface 2. In circumstances, said holes can cause the conductivity type of the layer 3 to be inverted locally, so that a so-called inversion layer can be formed at the surface 2. In the Figures the boundary of a coherent surface zone 15 situated below the gate electrode is shown in broken lines in which zones inversion can occur in the field effect transistor described.

The presence of such an inversion layer is very detrimental to a good operation of the field effect transistor since as a result of this instead of expansion of the depletion zone 14, an increase of the concentration of holes in the inversion layer will take place, when the negative control voltage at the gate electrode is increased.

In order to prevent the formation of such an inversion layer, the layer-shaped region 3 (see FIGS. 1 and 3) according to the invention comprises at the surface 2 four rectifying contacts in the form of diffused *p*-type zones 16, 17, 18 and 19 which form p-n junctions with the *n*-type layer 3. For example, (see FIG. 3) the zone 16 forms a p-n junction 20 with the layer 3. The zones 16, 17, 18 and 19 adjoin the abovementioned surface zone 15 in which inversion can occur. The zone 16 is furthermore connected through a window in the oxide layer 6 to a connection conductor which is formed by the aluminum layer 7 which also forms part of the gate electrode of the field effect transistor.

In the operating condition, p-n junction 20 as well as the p-n junctions between the zones 17, 18, 19 and the layer 3 will be polarized in the reverse direction, as a result of the negative potential of the gate electrode 7 relative to the layer 3. Consequently the holes present in the surface zone 15 will be drained out of said zone and the formation of the said inversion layer is prevented.

As a result of this there is no hindrance to expansion of the depletion zone 14 in the device according to the invention. Said depletion zone in the present example can extend throughout the thickness of the layer 3 in view of the doping and layer thickness chosen, so that the current between the source and drain electrodes can be cut off substantially, if desirable, when the voltage at the gate electrode is sufficiently negative.

The distances between two adjacent rectifying contacts associated with the electrode layer 7 (so between the zones 16 and 17, 17 and 18, 18 and 19 and between 19 and 16) are in this example each approximately 160 μm which is less than two diffusion lengths of holes in the layer 3, which diffusion length in this example is approximately 100 μm (average life of holes in the layer 3 approximately 15 μ sec.). As a result of this an effective draining of the holes present in the zone is achieved.

The device described can be manufactured, for example, as follows. Starting material is a highly-doped n-type silicon substrate on which an n-type silicon layer 3 having a resistivity of 10 Ohm.cm is grown epitaxially. Said layer is then thermally oxidized and the zones 8 and 9 are diffused in known manner over a depth of approximately 2 μm. The highly doped *n*-type substrate is then removed by electrolytically etching in a 5 percent HF-solution. Electrolysis is discontinued automatically at the boundary between the highly-doped material and the said epitaxial layer. The final operation is a chemical etching treatment which is continued down to a layer thickness of 2 μm. The resulting layer is then secured to a glass plate 5 by means of an epoxy resin 4 after which the contact windows and the various metal layers are provided.

FIG. 4 is a plan view and FIGS. 5 and 6 are diagrammatic cross-sectional views taken on the lines V — V and VI — VI of FIG. 4 of another embodiment of a semiconductor device according to the invention, likewise in the form of an insulated-gate field effect transistor. As regards dopings and dimensions this device corresponds substantially to the device shown in FIGS. 1 – 3 but it differs from said device in two important respects.

First of all, the *n*-type semiconductor layer in this example, as contrasted with the previous example, is not provided on an insulating substrate. The semiconductor body in this example contains an *n*-type silicon layer having a resistivity of 10 Ohm.cm which is grown epitaxially on a substrate 34 of p-type silicon having a resistivity of approximately 100 Ohm.cm which is provided with an ohmic contact 32. As a result of this (see FIGS. 5 and 6) a p-n junction 35 is formed which in the operating condition is polarized in the reverse direction by means of a voltage source 33 (see FIG. 5), a depletion zone being formed in the semiconductor body the boundaries 30 and 31 of which are shown in broken lines in FIGS. 5 and 6.

The second important difference from the construction shown in FIGS. 1 – 3 is that the rectifying contact with which according to the invention holes have to be drained from the coherent surface zone 15, is not formed in this example by a p-type semiconductor zone but by a rectifying contact between parts 26, 27, 28 and 29 of the metal layer 7 and the n-type region 3, see FIGS. 4 and 6. For that purpose the metal layer 7 consists of nickel which, with n-type silicon, can form a rectifying metal-semiconductor contact or Schottky barrier. Through windows in the oxide layer 6 the parts 26 – 29 of the nickel layer 7 adjoin the layer 3 and form therewith rectifying contacts which are polarized in the reverse direction in the operating condition as a result of the negative potential of the gate electrode 7.

The remaining properties and the operation of said device are furthermore quite analogous to those of the device shown in FIGS. 1 – 3 which, as already stated, has the same geometry and dimensions and the same doping concentrations. The source and drain contacts 10 and 11 are of aluminum as in the preceding example.

The boundary 30 of the depletion zone of the p-n junction 35 moves across said junction in the case of variation of the reverse voltage. Said depletion zone could be formed also by a metal-insulator semiconductor structure instead of by a p-n junction analogous to the depletion zone 14 and, if desirable, it can also be used for controlling the device.

FIG. 7 is a plan view and FIGS. 8, 9, 10 and 11 are diagrammatic cross-sectional views taken on the lines VIII — VIII, IX — IX, X — X and XI — XI of FIG. 7 of a quite different example of a device according to the invention. The device comprises a substrate 54 of p-type silicon having a resistivity of 10 Ohm.cm on which a monocrystalline *n*-type silicon layer 53 having a resistivity of 1 Ohm.cm and a thickness of 3 μm is grown epitaxially, see FIGS. 8 and 9. The layer 53 is covered at the surface 52 by a silicon oxide layer (56), 0.2 μm thick. On the layer 56 a conductor is provided in the form of a strip-shaped aluminum layer 57, 5 μm wide. A planar transistor having a *p*-type base zone 58, an *n*-type emitter zone 59, an emitter contact 60, a base contact 61 and a collector contact 62, is furthermore present in the layer 53, see FIGS. 7 and 8. This transistor is substantially entirely surrounded by the aluminum layer 57, see FIG. 7.

Beside the transistor described, a second transistor is provided in the layer 53 and has an emitter contact 63, a base contact 64 connected to the collector contact 62 of the first transistor and a collector contact 65, see FIG. 7. This transistor also is substantially entirely surrounded by the aluminum layer 57.

In the operating condition the electrode layer 57 is set up at a negative potential relative to the layer 53. This can be effected, for example, (see FIG. 7) by means of a voltage source 66 connected to the aluminum layer 57 and one of the collector contacts, for example, 65. As a result of this, electrons are removed from the part of the layer 53 situated below the layer 57, so that a depletion zone is formed there, the boundaries of which are denoted by broken lines 67, in the Figure, see FIGS. 9 and 10. When said depletion zone extends throughout the thickness of the layer 53, while the p-n junction 68 between the substrate 54 and the layer 53 is also polarized in the reverse direction (as is diagrammatically shown in FIG. 11), the part of the layer 53 in which the transistor (60, 61, 62) is situated and which is surrounded by the metal layer 57, is thereby electrically insulated from the substrate 54 and from the further part of the layer 53. The same holds true for the part of the layer 53 which is surrounded by the metal layer 57 and in which the transistor (63, 64, 65) is provided. The boundaries 72 and 73 of the depletion zone associated with the p-n junction 68 are denoted by broken lines in the Figures.

As in the preceding example, the problem presents itself that, usually in the layer 53 below the electrode layer 57, an inversion layer is formed in the zones 69 which adjoin the surface 52 and the boundaries of which are diagrammatically denoted by broken lines in the Figures, as a result of the negative potential of said electrode layer 57 relative to the layer 53. As a result of the presence of such inversion layers the depletion zones can substantially not extend further than the zones 69 and surely not throughout the thickness of the layer 53, unless inadmissibly high voltage differences are applied between the aluminum layer 57 and the silicon layer 53. Therefore, according to the invention, the *n*-type layer 53 at the surface 52 is provided in this case also with one or more rectifying contacts in the form of diffused *p*-type surface regions 70 which (see FIGS. 8 and 10) adjoin the zones 69 in which inversion layers might be formed. The aluminum layer 57 adjoins the zones 70 via contact windows (see FIGS. 7 and 10).

In the operating condition a negative voltage of approximately 30 volts is applied to the layer 57 relative to the layer 53 via the voltage source 66. Due to the presence of the zone 70 a depletion zone 67 can be formed in the layer 53 at said comparatively low voltage, which zone extends throughout the thickness of the layer 53 and thus, together with the p-n junction 68, ensures an effective electric insulation. The p-n junctions between the *p*-type zones 70 and the *n*-type layer 53 are actually polarized in the reverse direction by the voltage source 66 via the aluminum layer 57 and drain the holes formed by generation in the depletion zones 67 out of the surface zones 69 so that no inversion layer can be formed there.

The very narrow aluminum strip 57 occupies much less space than the conventional diffused separation channels which are used in integrated circuits for the mutual insulation of islands. The *p*-type zones 70 have comparatively small dimensions, for example, 10 μm × 20 μm, and can moreover advantageously be used in cross-overs of the aluminum layer 57 with other connections in the circuit, see, for example, FIGS. 7 and 10 (cross-over 60/57).

As in the example of FIGS. 4 – 6, one or several of the *p*-type zones 70 can of course be replaced by rectifying metal-semiconductor contacts, for example, by manufacturing the conductor 57 from nickel which forms rectifying contacts with the layer 53 via contact windows in the oxide layer 56. In order to obtain an uninterrupted insulating depletion zone 67 which fully surrounds the transistors, however, the layer 57 should be substantially uninterrupted at the area of said rectifying contact although a narrow slit or scratch is sometimes permissible.

It will furthermore be obvious that, analogous to the example shown in FIGS. 1 – 3, the layer 53 can be secured to an insulating substrate instead of to a *p*-type substrate 54.

The devices described in FIGS. 4 – 11 can be manufactured while using methods of oxidation, diffusion, epitaxial growing and vapor-deposition conventionally used in semiconductor technology in combination with known photolithographic etching methods.

It will be obvious that the invention is not restricted to the examples described but that many variations are possible to those skilled in the art without departing from the scope of this invention. Particularly, the rectifying contacts (16, 26, 70), instead of being connected directly to the electrode layers 7 and 57, respectively, can also be applied to the desired potential via a separate connection conductor, said potential being not necessarily the same as that of the said electrode layers. Furthermore, semiconductor materials other than silicon and insulating layers other than silicon oxide may be used, as well as other metal layers provided that they meet the conditions according to the invention. In addition, all conductivity types can be replaced by the opposite conductivity types, and other doping concentrations and dimensions may be used.

It is self-evident that besides in the field-effect transistors and insulation structure described in the Examples, the invention can be used with the same advantages in all devices in which in a semiconductor layer the current in the direction of the layer is influenced by a depletion zone the expansion of which in the direction of the thickness of the layer is prevented by the formation of an inversion layer as described in the specification.

What is claimed is:

1. A semiconductor insulated gate field-effect transistor comprising a semiconductor body having a layer-shaped region of a first conductivity type adjoining a surface of the body, spaced source and drain electrodes at the said body surface forming a main current path therebetween in the layer-shape region and adjacent the said surface, an electrically insulating layer on at least part of said surface, a gate electrode layer on said insulating layer and over the main current path in said layer-shaped region, means for applying to said gate electrode layer a potential relative to the source electrode and tending to establish a depletion zone in said layer-shaped region extending inward from the said surface in order to modify the electric resistance of the main current path of said layer-shaped region in a direction parallel to the surface, and means for preventing the formation of an inversion layer below the electrode layer inhibiting the inward extension of said depletion zone, said inversion layer preventing means comprising a rectifying contact to the layer-shaped region and located outside the main current path between the source and drain but substantially within a minority carrier diffusion length of where the inversion layer may be formed, means for applying to the said rectifying contact a reverse bias for draining generated minority carriers from said layer-shaped region thereby preventing the formation of said inversion layer, and means for applying a control voltage to the gate.

2. A semiconductor device as claimed in claim 1 wherein the layer-shaped region has such a thickness and doping concentration and the potential applied to the gate electrode layer is such that the depletion zone can extend throughout the thickness of said layer-shaped region.

3. A semiconductor device as claimed in claim 1 wherein the rectifying contact is directly d.c. connected to the electrode layer.

4. A semiconductor device as claimed in claim 1 wherein the rectifying contact comprises a metal layer provided on the layer-shaped region of the first conductivity type, said metal layer forming a rectifying metal-semiconductor contact with said layer-shaped region.

5. A semiconductor device as claimed in claim 4 wherein the electrode layer comprises a metal which forms a rectifying contact with the layer-shaped region of the first conductivity type and the said electrode layer adjoins the said layer-shaped region through an aperture in the insulating layer.

6. A semiconductor device as claimed in claim 1 wherein the rectifying contact comprises a surface zone of the second conductivity type adjoining the layer-shaped region of the first conductivity type.

7. A semiconductor device as claimed in claim 6 wherein the electrode layer adjoins the said zone of the second conductivity type through an aperture in the insulating layer.

8. A semiconductor device as claimed in claim 1 wherein the layer-shaped region of the first conductivity type comprises a monocrystalline semiconductor layer provided on an electrically insulating substrate.

9. A semiconductor device as claimed in claim 1 wherein the source and drain electrodes are formed by zones of the first conductivity type adjoining the surface, said last-named zones extending throughout the thickness of the layer-shaped region of the first conductivity type and having a higher doping than said layer-shaped region.

10. A semiconductor device comprising a body having a substrate and on the substrate a layer-shaped semiconductor region of a first conductivity type adjoining a surface of the body and electrically insulated from the substrate, an electrically insulating layer on at least part of said surface, plural semiconductor circuit elements in the layer-shaped region, an annular electrode layer on said insulating layer and over said layer-shaped region and substantially entirely surrounding at least one of the circuit elements, means for applying to said electrode layer a potential tending to establish a depletion zone in said layer-shaped region extending inward from the said surface throughout the thickness of said layer to isolate the said one circuit element from neighboring circuit elements, and means for preventing the formation of an inversion layer below the electrode layer inhibiting the inward extension of said depletion zone, said inversion layer preventing means comprising a rectifying contact to the layer-shaped region substantially within a minority carrier diffusion length of where the inversion layer may be formed, and means for applying to the said rectifying contact a reverse bias for draining generated minority carriers from said layer-shaped region thereby preventing the formation of said inversion layer, said rectifying contact having a relatively small lateral extent compared with that of the electrode layer.

11. A semiconductor device as claimed in claim 10 wherein plural spaced rectifying contacts are provided and spaced apart a distance of at most two diffusion lengths of the minority charge carriers in the layer-shaped region of the first conductivity type.

* * * * *